(12) United States Patent
Sugiyama

(10) Patent No.: US 9,059,367 B2
(45) Date of Patent: Jun. 16, 2015

(54) IMAGE SENSOR UNIT, IMAGE READING APPARATUS, IMAGE FORMING APPARATUS, AND MANUFACTURING METHOD

(71) Applicant: CANON COMPONENTS, INC., Kodama-gun, Saitama (JP)

(72) Inventor: Takeshi Sugiyama, Kodama-gun (JP)

(73) Assignee: CANON COMPONENTS, INC. (JP)

( * ) Notice: Subject to any disclaimer, the term of this patent is extended or adjusted under 35 U.S.C. 154(b) by 0 days.

(21) Appl. No.: 13/742,903

(22) Filed: Jan. 16, 2013

(65) Prior Publication Data

US 2013/0181311 A1 Jul. 18, 2013

(30) Foreign Application Priority Data

Jan. 17, 2012 (JP) ................................ 2012-007460
Jan. 10, 2013 (JP) ................................ 2013-002491

(51) Int. Cl.
*H04N 1/04* (2006.01)
*H01L 31/18* (2006.01)
(Continued)

(52) U.S. Cl.
CPC ........... *H01L 31/18* (2013.01); *Y10T 29/49286* (2015.01); *Y10T 156/1089* (2015.01);
(Continued)

(58) Field of Classification Search
CPC .............. H04N 1/01815; H04N 1/193; H04N 1/40056; H04N 2201/02868; H04N 1/1013; H04N 3/1581; H04N 1/031; H04N 1/03; H04N 2201/03183; H04L 27/14665

USPC ......... 358/482, 483, 408, 497, 496, 474, 484, 358/475, 505, 509, 512–514; 250/208.1, 250/239, 234–236, 216; 350/40
See application file for complete search history.

(56) References Cited

U.S. PATENT DOCUMENTS 5,038,027 A 8/1991 Ioka
5,570,122 A 10/1996 Imamura et al.
(Continued)

FOREIGN PATENT DOCUMENTS

JP 02-177761 A 7/1990
JP 02177761 A * 7/1990
(Continued)

OTHER PUBLICATIONS

Extended European Search report issued in European counterpart application No. EP13151459.8, dated Dec. 3, 2013.
(Continued)

*Primary Examiner* — Cheukfan Lee
(74) *Attorney, Agent, or Firm* — Rossi, Kimms & McDowell LLP

(57) ABSTRACT

An image sensor unit includes: sensor substrates on which a plurality of sensor chips are mounted; a plurality of rod-lens arrays that focus light from an original on the sensor substrates; and a frame body that houses the plurality of sensor substrates and the plurality of rod-lens arrays. The frame body is divided into a first frame and a second frame. A side surface of the plurality of rod-lens arrays in a sub-scan direction is fixed only by the first frame, and the plurality of rod-lens arrays are arranged in the main-scan direction. The plurality of rod-lens arrays is fixed to the first frame by applying a first adhesive and a second adhesive, respectively, the viscosity of the first adhesive exceeds the viscosity of the second adhesive, and the adhesive range of the first adhesive is greater than the adhesive range of the second adhesive.

15 Claims, 12 Drawing Sheets

(51) Int. Cl.
   *H04N 1/193* (2006.01)
   *H01L 31/0232* (2014.01)
   *H04N 1/192* (2006.01)

(52) U.S. Cl.
   CPC .......... *H04N1/193* (2013.01); *H01L 31/0232* (2013.01); *H04N 1/192* (2013.01); *H04N 1/1931* (2013.01); *H04N 1/1932* (2013.01); *H04N 1/1933* (2013.01); *H04N 1/1934* (2013.01); *H04N 1/1935* (2013.01); *H04N 1/1938* (2013.01)

(56) References Cited

U.S. PATENT DOCUMENTS

| | | | |
|---|---|---|---|
| 5,859,421 A | 1/1999 | Onishi et al. | |
| 6,147,339 A | 11/2000 | Matsumoto | |
| 6,967,751 B2 | 11/2005 | Nagata | |
| 7,012,235 B2 * | 3/2006 | Matsumoto | 250/208.1 |
| 8,049,937 B2 * | 11/2011 | Saito | 358/474 |
| 2001/0028506 A1 | 10/2001 | Fujimoto et al. | |
| 2002/0030858 A1 | 3/2002 | Nagata | |
| 2003/0072041 A1 | 4/2003 | Sawada | |
| 2010/0238520 A1 | 9/2010 | Nagata | |
| 2011/0007368 A1 | 1/2011 | Saito | |
| 2012/0194878 A1 * | 8/2012 | Nakamura | 358/471 |

FOREIGN PATENT DOCUMENTS

| | | | |
|---|---|---|---|
| JP | 04-334160 A | | 11/1992 |
| JP | 05-075784 A | | 3/1993 |
| JP | 06186651 A | * | 7/1994 |
| JP | 2000-059564 A | | 2/2000 |
| JP | 2001157007 A | * | 6/2001 |
| JP | 2002-57844 A | | 2/2002 |
| JP | 2010-187187 A | | 8/2010 |
| JP | 2010-243566 A | | 10/2010 |
| WO | 2010/106656 A1 | | 9/2010 |

OTHER PUBLICATIONS

Japanese Office Action cited in Japanese counterpart application No. JP2013-002491, dated Feb. 4, 2014.

* cited by examiner

IMAGE SENSOR UNIT, IMAGE READING APPARATUS, IMAGE FORMING APPARATUS, AND MANUFACTURING METHOD

CROSS-REFERENCE TO RELATED APPLICATIONS

This application is based upon and claims the benefit of priority of the prior Japanese Patent Application No. 2012-007460, filed on Jan. 17, 2012, and the Japanese Patent Application No. 2013-002491, filed on Jan. 10, 2013, the entire contents of which are incorporated herein by reference.

BACKGROUND OF THE INVENTION

1. Field of the Invention

The present invention relates to an image sensor unit, an image reading apparatus, an image forming apparatus, a manufacturing method of the image sensor unit, a manufacturing method of the image reading apparatus, and a manufacturing method of the image forming apparatus. Particularly, the present invention relates to an image sensor unit that reads large originals and the like, an image reading apparatus, an image forming apparatus, a manufacturing method of the image sensor unit, a manufacturing method of the image reading apparatus, and a manufacturing method of the image forming apparatus.

2. Description of the Related Art

Readable lengths (hereinafter, "read lengths") of originals are generally about A4, B4, and A3 sizes in an image sensor unit used in an image reading apparatus, such as a facsimile and a scanner. In recent years, an elongated image sensor unit that can read large originals in A2, A1, and A0 sizes exceeding the read length of A3 size is used in an image reading apparatus, such as an electronic white board.

The image sensor unit of the image reading apparatus that reads large originals and the like exceeding the A3 size includes a plurality of rod-lens arrays shorter than the A3 size arranged in series in a main-scan direction.

For example, Patent Document 1 discloses a contact image sensor (image sensor unit) elongated by connecting a plurality of rod-lens arrays.

Patent Document 1
Japanese Laid-open Patent Publication No. 2010-187187

In order for the rod-lens arrays arranged in a line in the main-scan direction to accurately focus reflected light from an original on sensor chips, the rod-lens arrays need to be fixed by accurately positioning the rod-lens arrays so that rod lenses of adjacent rod-lens arrays are disposed at predetermined intervals. However, there is a problem that work of accurately positioning the rod-lens arrays inserted to thin grooves of frames is significantly difficult.

SUMMARY OF THE INVENTION

The present invention has been made in view of the problem described above, and an object of the present invention is to accurately dispose a plurality of rod-lens arrays in disposing a plurality of rod-lens arrays in a line in the main-scan direction.

The present invention provides an image sensor unit including: sensor substrates on which a plurality of photoelectric conversion elements are mounted; a plurality of rod-lens arrays that focus light from an object to be read on the sensor substrates; and a frame body that houses the plurality of sensor substrates and the plurality of rod-lens arrays, wherein the frame body is divided into a first frame and a second frame, a side surface of the plurality of rod-lens arrays in a sub-scan direction is fixed only by the first frame, and the plurality of rod-lens arrays are arranged in the main-scan direction.

The present invention provides an image reading apparatus including: an image sensor unit; and image reading means that reads light from an object to be read while relatively moving the image sensor unit and the object to be read, wherein the image sensor unit is the image sensor unit described above.

The present invention provides an image forming apparatus including: an image sensor unit; image reading means that reads light from an object to be read while relatively moving the image sensor unit and the object to be read; and image forming means that forms an image on a recording medium, wherein the image sensor unit is the image sensor unit described above.

DETAILED DESCRIPTION OF THE PREFERRED EMBODIMENTS

Figure 1:
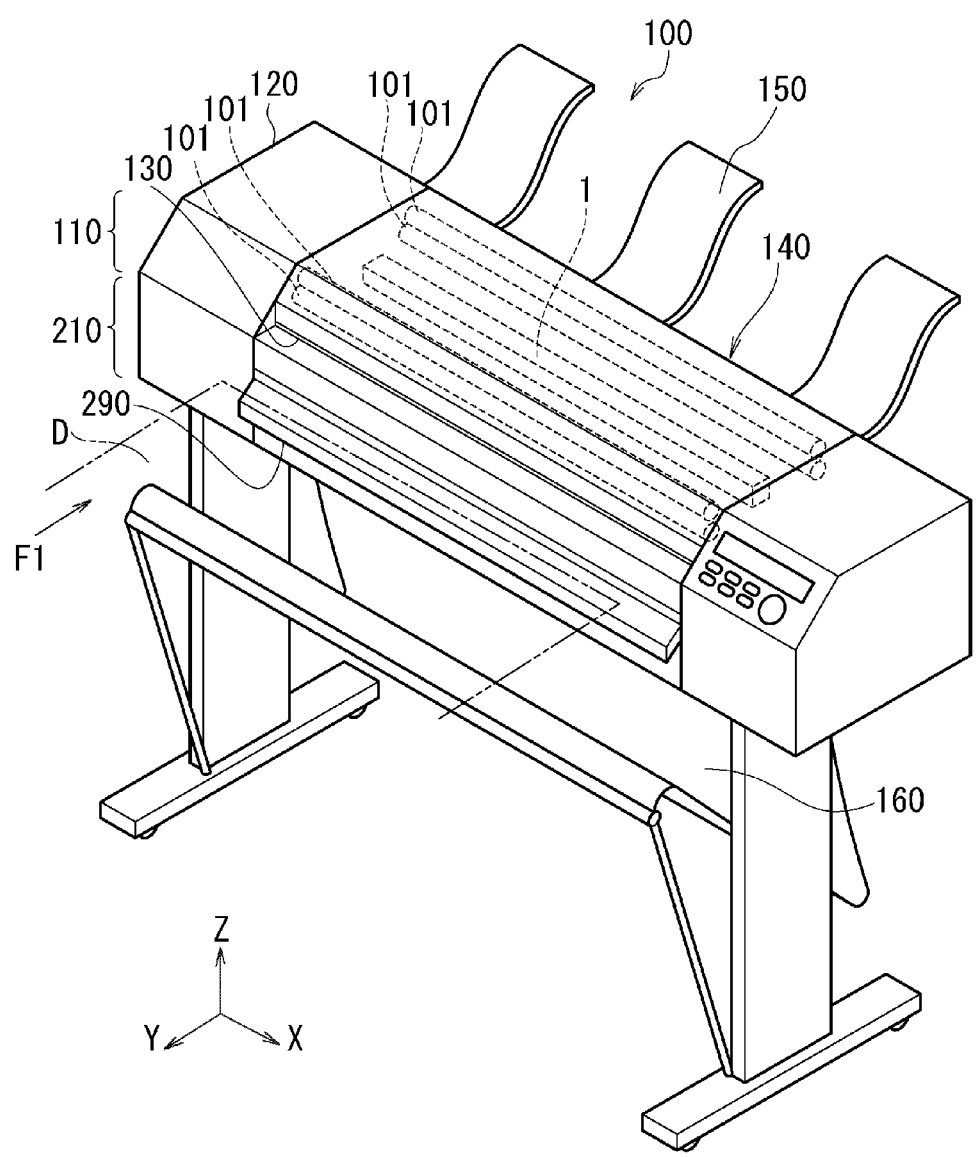
FIG. 1 is a perspective view illustrating an appearance of an MFP including an image sensor unit 1 according to present embodiments.

Embodiments that can apply the present invention will now be described in detail with reference to the drawings.

In the present embodiments, an image sensor unit described later as well as an image reading apparatus and an image forming apparatus to which the image sensor unit is applied will be described. In the drawings described below, a main-scan direction of the image sensor unit is indicated by an X direction, a sub-scan direction is indicated by a Y direction, and a direction orthogonal to the main-scan direction and the sub-scan direction is indicated by a Z direction, as necessary. In the image reading apparatus and the image forming apparatus, the image sensor unit emits light to an original D as an object to be read, and reflected light is converted to an electric signal to read an image (reflection reading). The object to be read is not limited to the original D, and other objects to be read can also be applied. Transmission reading can also be applied.

A structure of a multi-function printer (MFP) as sample of an image reading apparatus or an image forming apparatus will be described with reference to FIG. 1. FIG. 1 is a perspective view illustrating an appearance of an MFP 100 that can handle a large original. As shown in FIG. 1, the MFP 100 includes: an image reading portion 110 as image reading means that is a sheet-feed type image scanner and that reads reflected light from a large original D in an A0 size, A1 size, or the like; and an image forming portion 210 as image forming means that forms (prints) an image of the original D on a roll sheet R (recording paper) as a recording medium.

The image reading portion 110 has a function of a so-called image scanner and is configured, for example, as follows. The image reading portion 110 includes a housing 120, a paper feeding opening 130, an original discharge opening 140, an original recovery unit 150, a sheet recovery unit 160, an image sensor unit 1, and original conveyor rollers 101.

The image sensor unit 1 is, for example, a contact image sensor (CIS) unit. The image sensor unit 1 is fixed in the housing 120.

In the image reading portion 110, the original D inserted from the paper feeding opening 130 to the housing 120 is placed between the original conveyor rollers 101 rotated and driven by a driving mechanism and conveyed relative to the image sensor unit 1 at a predetermined conveyance speed. The image sensor unit 1 optically reads the conveyed original D, and a sensor chip 7 described later converts the original D to an electric signal to perform a reading operation of an image. The original D subjected to image reading is conveyed by the original conveyor rollers 101 and discharged from the original discharge opening 140. The original recovery unit 150 disposed on the backside of the housing 120 recovers the original D discharged from the original discharge opening 140.

Figure 2:
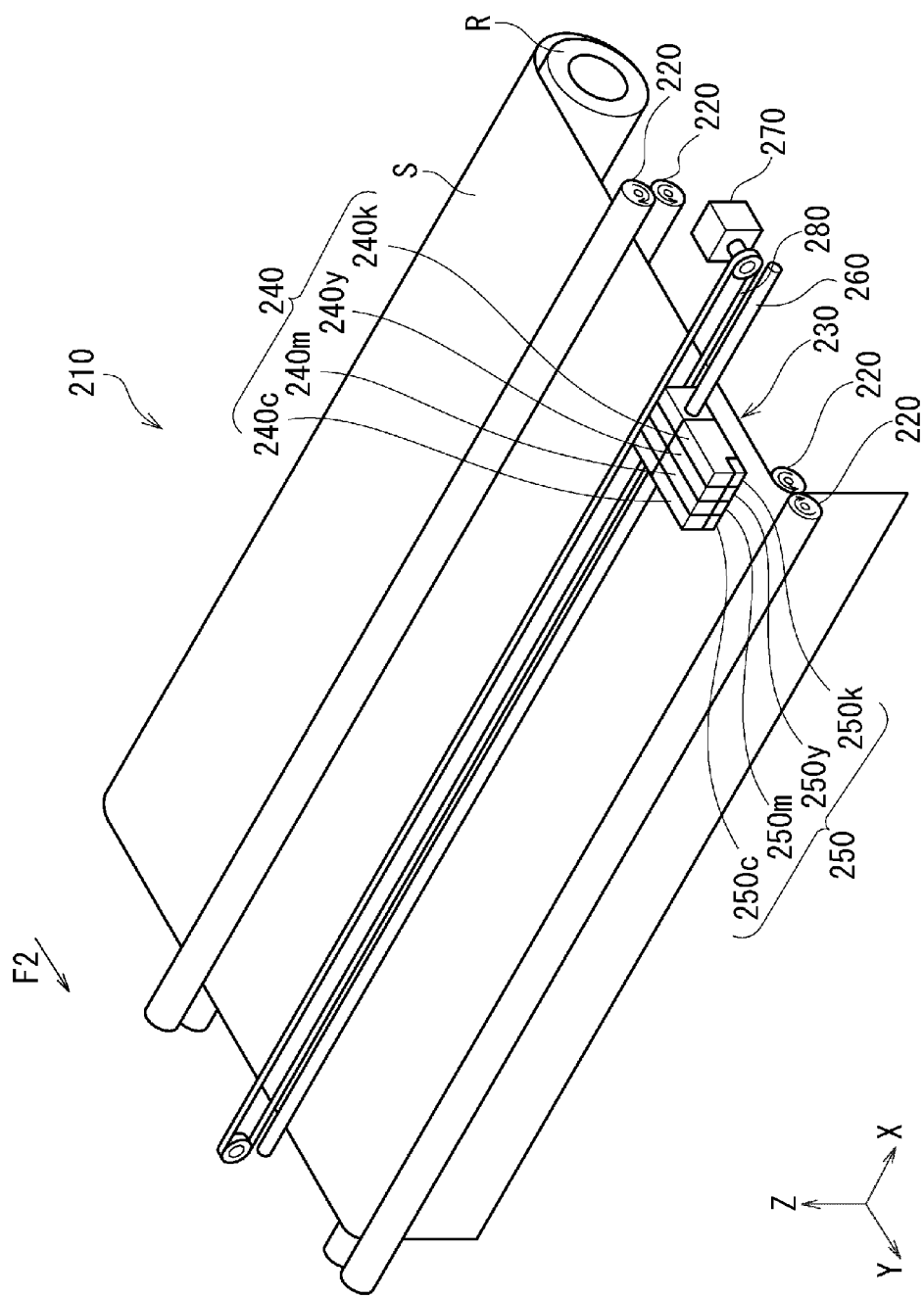
FIG. 2 is a schematic view illustrating a structure of an image forming portion in the MFP.

FIG. 2 is a schematic view illustrating a structure of the image forming portion 210.

The image forming portion 210 with a function of a so-called printer is housed in the housing 120 and is configured, for example, as follows. The image forming portion 210 includes a roll sheet R, sheet conveyor rollers 220, and a printer head 230. The printer head 230 includes, for example, ink tanks 240 (240c, 240m, 240y, and 240k) with cyan C, magenta M, yellow Y, and black K inks and discharge heads 250 (250c, 250m, 250y, and 250k) arranged on the ink tanks 240, respectively. The image forming portion 210 also includes a printer head slide shaft 260, a printer head drive motor 270, and a belt 280 attached to the printer head 230. As shown in FIG. 1, the image forming portion 210 further includes a sheet discharge opening 290 from which a printed sheet S is discharged.

In the image forming portion 210, the sheet S as one end of the continuous roll sheet R is placed between the sheet conveyor rollers 220 rotated and driven by the driving mechanism and is conveyed in a conveyance direction F2 to a printing position. The printer head drive motor 270 mechanically moves the belt 280, and the printer head 230 moves in the printing direction (main-scan direction) along the printer head slide shaft 260 to print the image on the sheet S based on the electric signal. The operation is repeated until the printing is finished, and the printed sheet S is cut in the main-scan direction. The cut sheet S is discharged from the sheet discharge opening 290 by the sheet conveyor rollers 220. The sheet recovery unit 160 disposed below the housing 120 recovers the sheet S discharged from the sheet discharge opening 290.

Although an inkjet-type image forming apparatus has been described as the image forming portion 210, the type can be any type, such as an electrophotographic type, a thermal transfer type, and a dot impact type.

(First Embodiment)

Constituent members of the image sensor unit 1 will be described with reference to FIGS. 3 to 5.

Figure 3:
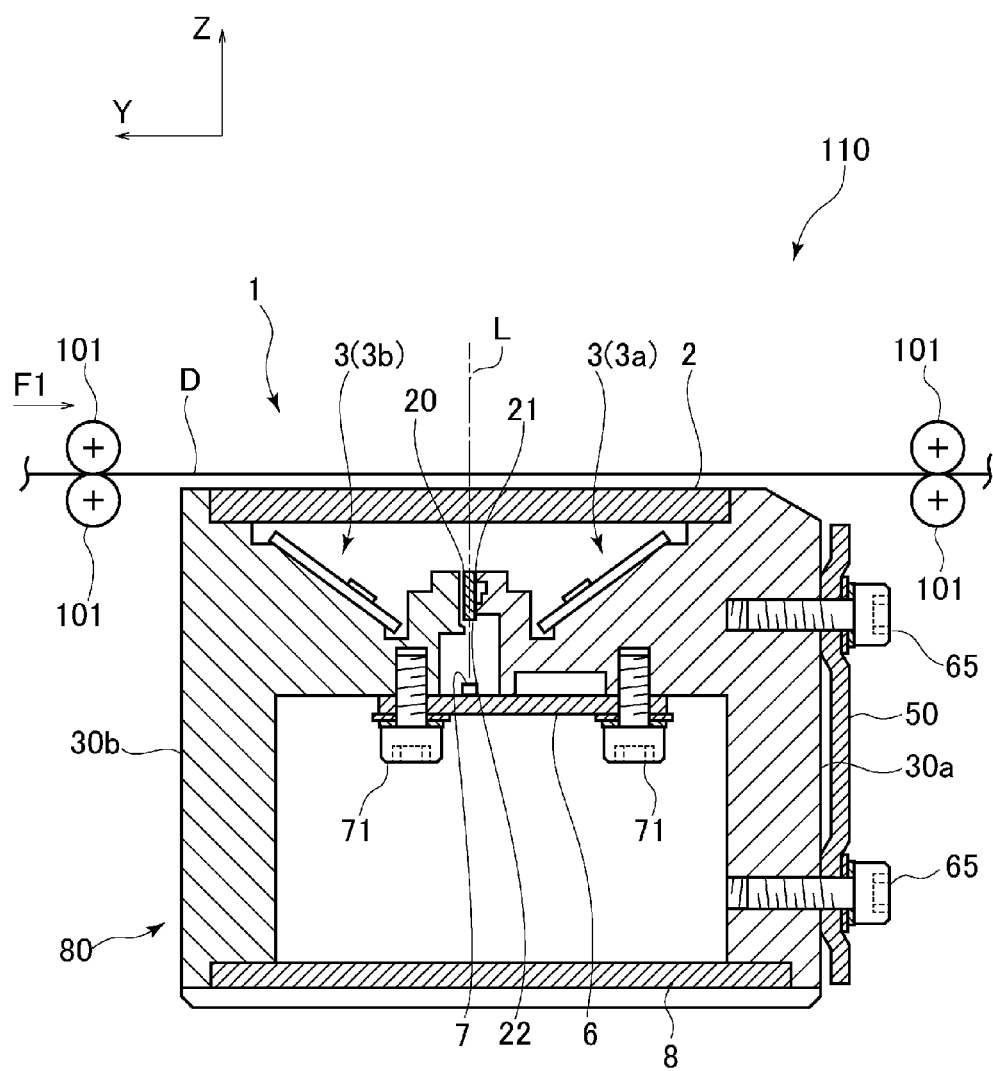
FIG. 3 is a sectional view illustrating a configuration of part of an image reading portion in the MFP including the image sensor unit according to a first embodiment.
Figure 4:
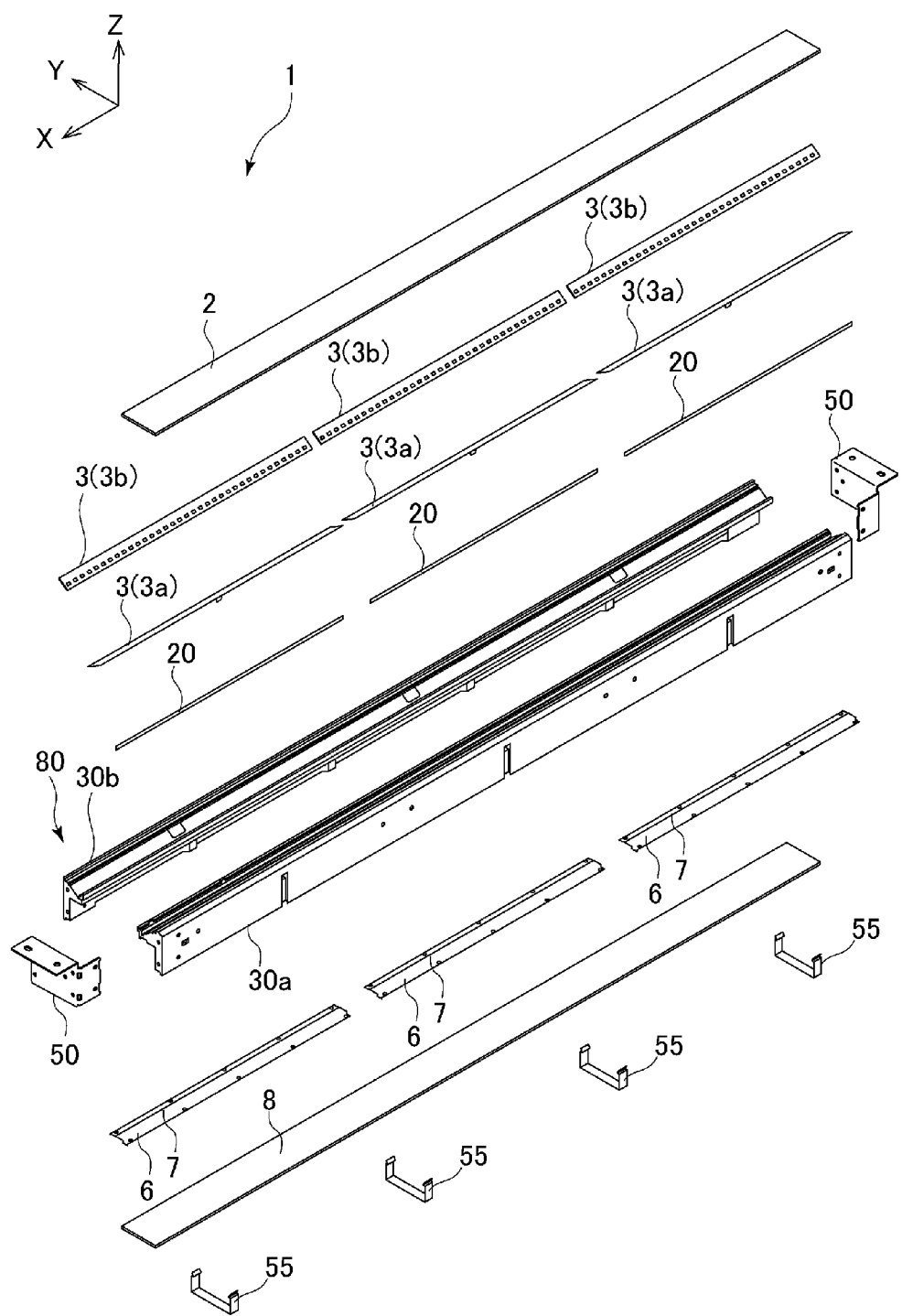
FIG. 4 is a schematic exploded perspective view of the image sensor unit.

FIG. 3 is a sectional view illustrating a configuration of the image reading portion 110 in the MFP 100 including the image sensor unit 1 according to a first embodiment. FIG. 4 is a schematic exploded perspective view of the image sensor unit 1. FIG. 5 is a schematic exploded perspective view of part of the image sensor unit 1.

The image sensor unit 1 includes a cover glass 2 as a transparent member, light sources 3 (3a and 3b), a rod-lens array 20 as a light condenser, a sensor substrate 6, the sensor chip 7 as a photoelectric conversion element, a lower cover 8 as a cover member, a frame body 80 as a supporting body that house the constituent elements, a side plate member 50, a cover holding member 55, and the like. Among the constituent elements, the cover glass 2, the frame body 80, and the lower cover 8 are formed long in the main-scan direction according to the read length of the large original D.

The cover glass 2 prevents dust from entering the frame body 80. The cover glass 2 is planar and fixed on an upper part of the frame body 80. A plate of glass, a plate made of a transparent resin material, or the like can be applied as the transparent member.

The light sources 3 (3a and 3b) illuminate the original D. As shown in FIG. 3, the light sources 3a and 3b are fixed at positions below the cover glass 2, symmetric about the rod-lens array 20. As illustrated in FIG. 5, each light source 3 includes, for example: light emitting elements 4r, 4g, and 4b with wavelengths of three colors of red R, green G, and blue B; and a substrate 5 for mounting the light emitting elements 4r, 4g, and 4b. The light emitting elements 4r, 4g, and 4b are, for example, LED chips and are mounted at predetermined intervals in a predetermined order on the substrate 5 formed long in the main-scan direction. Each of the light sources 3a and 3b of the present embodiment is arranging in a line, in the main-scan direction, a plurality of substrates (for example, three in A3 size) used for a short image sensor unit with a normal read length (for example, A4 or A3 size).

The rod-lens array 20 is an optical member to focus reflected light from the original D on the sensor chip 7 mounted on the sensor substrate 6. As shown in FIG. 3, the rod-lens array 20 is disposed at a center position of the light sources 3a and 3b. The sensor chip 7 is positioned on an extension of an optical axis (line L shown in FIG. 5) formed between an incident surface 21 and an emission surface 22 of the rod-lens array 20. As shown in FIG. 5, the rod-lens array 20 includes a plurality of rod lenses 23 as imaging elements of an erect equal magnification imaging type arranged in the main-scan direction. The rod-lens array 20 of the present embodiment is arranging in a line in the main-scan direction, a plurality of rod-lens arrays (for example, three in A3 size) used for a short image sensor unit.

A plurality of sensor chips 7 that convert the reflected light focused by the rod-lens arrays 20 to electrical signals are mounted on the sensor substrate 6 in the main-scan direction (longitudinal direction). The sensor substrate 6 is fixed to the frame body 80. The sensor substrate 6 of the present embodiment is arranging in a line in the main-scan direction, a plurality of sensor substrates (for example, three in A3 size) used for a short image sensor unit.

The lower cover 8 prevents dust from entering the frame body 80. The lower cover 8 is formed by a planar resin or the like and is fixed below the frames body 80.

The frame body 80 houses the constituent members of the image sensor unit 1. A plurality of projections and recesses are formed inside of the frame body 80 to position and hold the constituent members of the image sensor unit 1. The frame body 80 of the present embodiment is divided into a first frame 30a and a second frame 30b to accurately fix and arrange the plurality of rod-lens arrays 20 in a line in the main-scan direction. As shown in FIG. 4, the first frame 30a and the second frame 30b are elongated long in the main-scan direction, and the length is a little longer than the read length. Ends of the first frame 30a and the second frame 30b are coupled by the side plate members 50 described later, and the first frame 30a and the second frame 30b function as one frame body 80.

Figure 6:
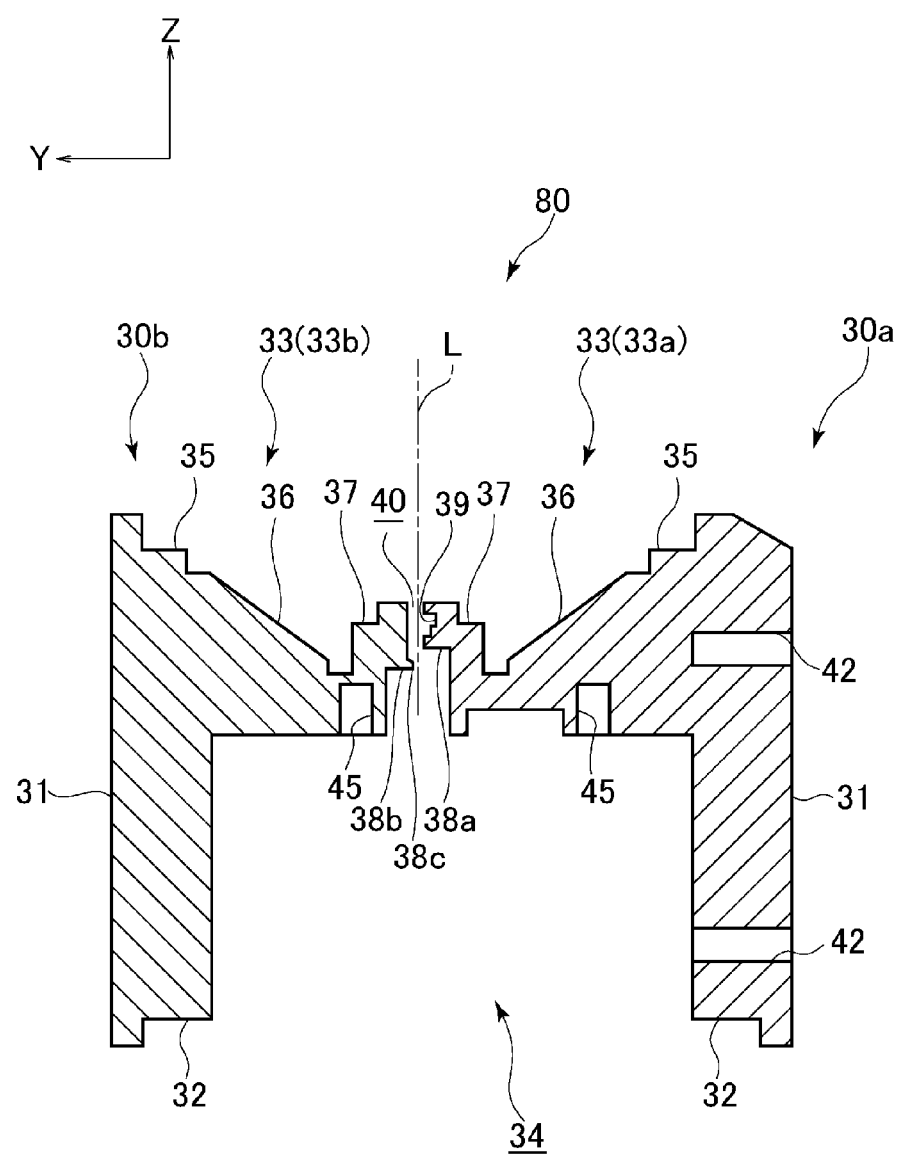
FIG. 6 is a sectional view of a first frame and a second frame.

FIG. 6 is a sectional view of the first frame 30a and the second frame 30b. The first frame 30a and the second frame 30b shown in FIG. 6 are illustrated by maintaining the positional relationship obtained by coupling the first frame 30a and the second frame 30b by the side plate members 50. In the following description, "upper" denotes a side to which the original D is conveyed in the Z direction, and "lower" denotes a side where the lower cover 8 is fixed in the Z direction.

Side wall parts 31 are formed on the first frame 30a and the second frame 30b in the Z direction. A cut-out shaped cover setting portion 32 for attaching the lower cover 8 is formed on a lower surface of each side wall part 31. Extended portions 33 (33a and 33b) extended in the sub-scan direction and facing each other are formed above the side wall parts 31. The sensor substrate 6 and a relay substrate not shown are installed in a space 34 with a rectangular cross section surrounded by the side wall parts 31 and the extended portions 33.

A transparent member setting portion 35 for attaching the cover glass 2 and a light source setting portion 36 for attaching the light source 3 are formed on the upper surface of each of the extended portions 33a and 33b. The transparent member setting portions 35 are formed at positions close to the side wall parts 31. The light source setting portions 36 are inclined downward toward the tips of the extended portions 33a and 33b.

A step-shaped step portion 37 that rises toward the tip is formed closer to the tip of each of the extended portions 33a and 33b. A first opposing portion 38a protruding in the sub-scan direction is formed at the tip of the step portion 37 of the extended portion 33a. A second opposing portion 38b protruding in the sub-scan direction is formed at the tip of the step portion 37 of the extended portion 33b. The first opposing portion 38a and the second opposing portion 38b face each other. A filling groove 39 filled with a first adhesive described later is continuously formed on the side surface of the first opposing portion 38a in the main-scan direction.

A space between the first opposing portion 38a and the second opposing portion 38b is included as a disposing portion 40 positioned on a line L and on which the rod-lens arrays 20 are disposed. The disposing portion 40 is greater than the sectional shape of the rod-lens arrays 20 and is continuously formed in the main-scan direction. The frame body 80 of the present embodiment is divided into the first frame 30a and the second frame 30b in the left and right direction, i.e. sub-scan direction, across the disposing portion 40.

The first frame 30a and the second frame 30b are formed by, for example, extrusion molding, using a rigid material, such as aluminum and an aluminum alloy. When the frames are molded by a resin, the frames hang down near the center in the main-scan direction in an elongated image sensor unit due to the weight of the frames. The focal point of the rod-lens arrays and the original D may be displaced. The use of a rigid material for the first frame 30a and the second frame 30b can prevent the deformation of the frame body 80 caused by the weight. The formation of the first frame 30a and the second frame 30b by the extrusion molding can reduce the manufacturing cost, such as expense for a mold.

Figure 5:
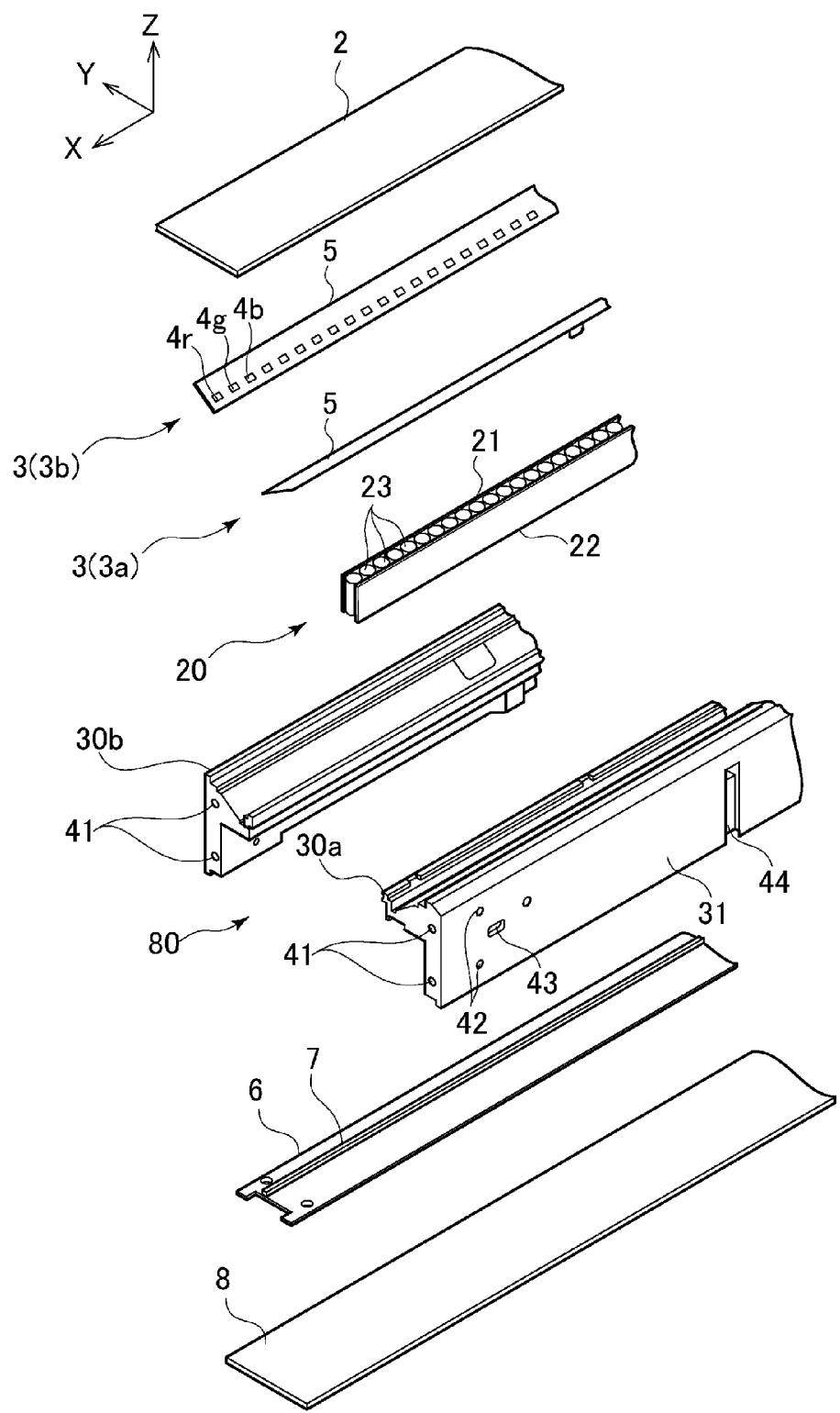
FIG. 5 is an enlarged schematic exploded perspective view of part of the image sensor unit.

As shown in FIG. 5, a plurality of (for example, two) screw holes 41 are fabricated on an end face of each of the first frame 30a and the second frame 30b. A plurality of (for example, two) screw holes 42 are fabricated outside of the side wall part 31 of the first frame 30a (see also FIG. 6). The screw holes 41 and the screw holes 42 are formed not only on one end in the main-scan direction shown in FIG. 5, but also on the other end. As shown in FIG. 5, a locking groove 43 for locking the cover holding member 55 and a wiring groove 44 for wiring a cable extended from the substrate 5 are fabricated at a predetermined interval in the main-scan direction outside of each side wall part 31 of the first frame 30a and the second frame 30b. As shown in FIG. 6, screw holes 45 are fabricated at a predetermined interval in the main-scan direction on the lower surfaces of the extended portions 33 of the first frame 30a and the second frame 30b. Application grooves 46 are fabricated at a predetermined interval in the main-scan direction on an upper part of the first opposing portion 38a (see FIG. 7B).

The divided configuration of the first frame 30a and the second frame 30b across the disposing portion 40 can fix the first frame 30a and the rod-lens arrays 20 without the arrangement of the second frame 30b. Therefore, the plurality of rod-lens arrays 20 can be accurately arranged in a line in the main-scan direction, and the workability improves.

When the MFP 100 including the image sensor unit 1 configured as described above reads the original D, the image reading portion 110 successively activates the light emitting elements 4r, 4g, and 4b of the light sources 3a and 3b of the image sensor unit 1 to emit light on the original D conveyed by the original conveyor rollers 101 in the conveyance direction F1 at a predetermined conveyance speed. The light emitted from the light sources 3a and 3b is directed to the reading surface of the original D from two directions across the rod-lens arrays 20 to linearly and uniformly radiate the light throughout the main-scan direction. The original D reflects the radiated light to focus the light on the sensor chips 7 through the rod-lens arrays 20. The sensor chips 7 convert the focused reflected light to electric signals, and a signal processing unit (not shown) processes the electric signals.

In this way, the image reading portion 110 reads the reflected light of R, G, and B of one scan line to complete the reading operation of one scan line in the main-scan direction of the original D. After the end of the reading operation of one scan line, a reading operation of the next one scan line is performed in the same way as the operation described above along with the movement of the original D in the sub-scan direction. In this way, the image reading portion 110 repeats the reading operation of one scan line, while conveying the original D in the conveyance direction F1, to read the image of the entire surface of the original D.

Hereinafter, a manufacturing method of the image sensor unit 1 will be specifically described with reference to the drawings.

(Step 1)

An assembly worker sets the light sources 3a and 3b on the light source setting portions 36 of the first frame 30a and the second frame 30b. The light sources 3a and 3b can be set while the first frame 30a and the second frame 30b are separated. Therefore, other frames do not interfere with the installation of the light sources 3a and 3b, and the workability improves.

Figure 7A:
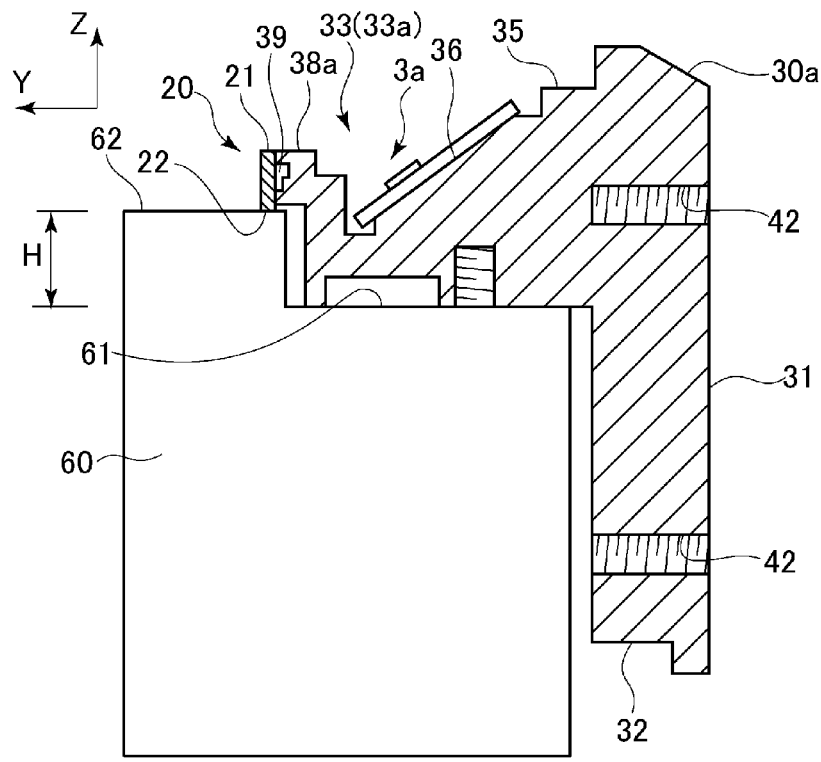
FIG. 7A is a sectional view for explaining a method of fixing rod-lens arrays.
Figure 7B:
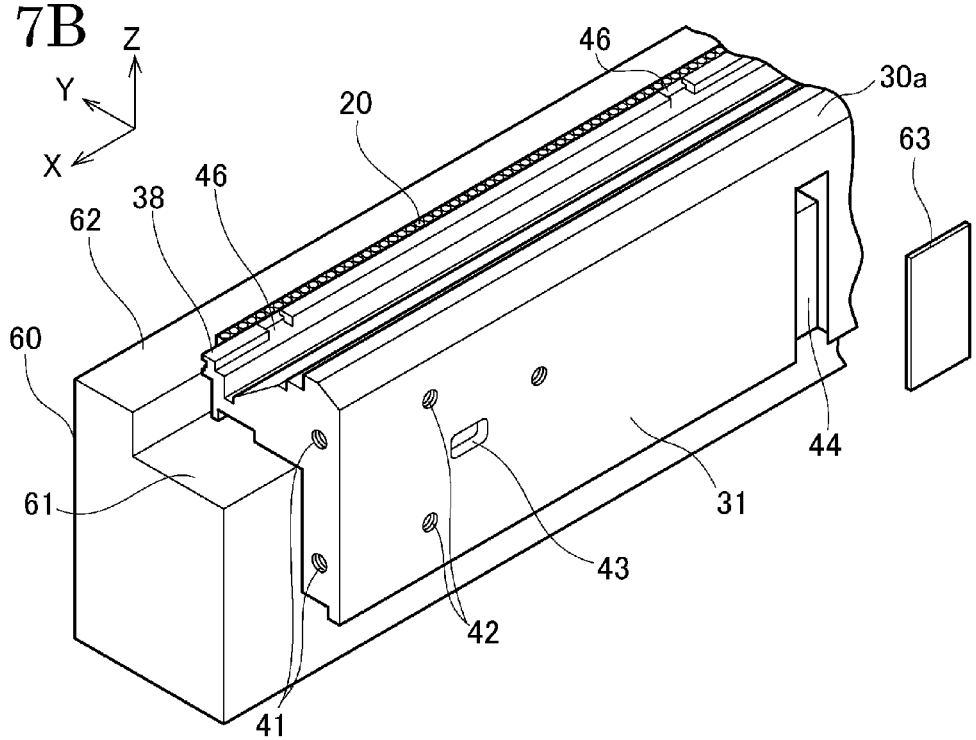
FIG. 7B is a perspective view for explaining the method of fixing the rod-lens arrays.

Specifically, the assembly worker linearly arranges three substrates 5, on which the light emitting elements 4r, 4g, and 4b are mounted, on the light source setting portions 36 in the main-scan direction and uses an adhesive or the like to fix the substrates 5. In this case, a cable not shown extending from the lower surface of each substrate 5 is wired below the extended portion 33a through the wiring groove 44 formed on the side wall part 31 of the first frame 30a. As shown in FIG. 7B, the assembly worker attaches light blocking members 63 to the wiring grooves 44 formed on the first frame 30a and the second frame 30b as necessary.

(Step 2)

The assembly worker fixes the plurality of rod-lens arrays 20 to the first frame 30a (rod-lens array fixation step). A jig 60 as shown in FIGS. 7A and 7B is used here. The jig 60 is longer than the length of the first frame 30a in the main-scan direction. The jig 60 includes: a frame placement portion 61 on which the extended portion 33a of the first frame 30a is placed; and a lens placement portion 62 on which the rod-lens array 20 is placed. The height from the frame placement portion 61 to the lens placement portion 62 in the jig 60 is set to a predetermined height H.

Specifically, the assembly worker fills the filling groove 39 of the first opposing portion 38a with the first adhesive. An adhesive with moderate viscosity and long curing time is used as the first adhesive. As shown in FIG. 7B, the assembly worker places the first frame 30a on the frame placement portion 61 of the jig 60. The assembly worker places the first rod-lens array 20 of the plurality of rod-lens array 20 on the lens placement portion 62 of the jig 60 and presses one side surface in the sub-scan direction against the first opposing portion 38a. In this case, it is preferable that the adhesion is at a position displaced in the main-scan direction from the end face of the first frame 30a to prevent the rod-lens array 20 from touching the side plate member 50.

Although the first rod-lens array 20 adheres on some level to the opposing portion 38 of the first frame 30a through the first adhesive, it takes time for the first adhesive to cure. Therefore, the first rod-lens array 20 can be moved while being adhered to the first frame 30a.

The assembly worker arranges the second rod-lens array 20 in line with the first rod-lens array 20 in the main-scan direction and presses one side surface in the sub-scan direction against the first opposing portion 38a while placing the second rod-lens array 20 on the lens placement portion 62 of the jig 60. Although the second rod-lens array 20 is adhered on some level to the first opposing portion 38a through the first adhesive, it takes time for the first adhesive to cure. Therefore, the second rod-lens array 20 can be moved while being adhered to the first frame 30a.

While pressing the two adjacent rod-lens arrays 20 against the first opposing portion 38a, the assembly worker makes an observation by, for example, a camera to move and adjust the first rod-lens array 20 or the second rod-lens array 20 in the main-scan direction to dispose the rod lenses 23 of the adjacent rod-lens arrays 20 at predetermined intervals.

In this case, since the first frame 30a is divided across the disposing portion 40, the rod-lens arrays 20 can be moved and adjusted, while the rod-lens arrays 20 and the first opposing portion 38a are exposed. More specifically, a wide space for holding the rod-lens arrays 20 can be secured when the first opposing portion 38a of the rod-lens arrays 20 is moved in the main-scan direction. Therefore, the plurality of rod-lens arrays 20 can be accurately disposed in the main-scan direction, and the workability can be improved.

The assembly worker applies a second adhesive on the application grooves 46 for applying the second adhesive formed on the upper part of the first opposing portion 38a as shown in FIG. 7B. An adhesive with less viscosity and less curing time compared to the first adhesive is used as the second adhesive. A case of using an ultraviolet curable resin as the second adhesive will be described here.

The assembly worker can illuminate ultraviolet light to the second adhesive applied to the application grooves 46 to accurately dispose and position the adjacent rod-lens arrays 20 in the main-scan direction. An adhesive range of the first adhesive is a range of the filling groove 39 throughout the main-scan direction formed on the first opposing portion 38a, and an adhesive range of the second adhesive is a range of the application grooves 46 formed on the upper part of the first opposing portion 38a and formed at predetermined intervals in the main-scan direction. Therefore, the adhesive range of the first adhesive is greater than the adhesive range of the second adhesive, and ultimately, the first adhesive mainly fixes the first frame 30a and the rod-lens arrays 20.

Since the materials of the first frame 30a and the rod-lens arrays 20 are different, coefficients of linear expansion are different. Therefore, if the temperature changes due to the use environment of the image sensor unit 1, the amount of expansion and contraction in the main-scan direction varies between the first frame 30a and the rod-lens arrays 20. In this case, if the first frame 30a and the rod-lens arrays 20 are fixed by an adhesive without viscosity, the first frame 30a and the rod-lens arrays 20 are deformed due to the difference in the amount of expansion and contraction. On the other hand, if the first frame 30a and the rod-lens arrays 20 are fixed by the first adhesive with viscosity, the first adhesive absorbs the difference in the amount of expansion and contraction between the both. This can prevent the deformation of the first frame 30a and the rod-lens arrays 20. Since the adhesive range of the second adhesive with less viscosity is smaller than the adhesive range of the first adhesive, the second adhesive cannot prevent the absorption of the amount of expansion and contraction by the first adhesive.

The assembly worker can assemble the third rod-lens array 20 in the same way as the second rod-lens array 20. As a result, the plurality of rod-lens arrays 20 can be accurately disposed and positioned in the main-scan direction.

The jig 60 is used to assemble the plurality of rod-lens arrays 20 adhered to the first frame 30a. The height of the jig 60 from the frame placement portion 61 to the lens placement portion 62 is set to a predetermined height H. Therefore, the distance from the frame placement portion 61 to the emission surface 22 of all rod-lens arrays 20 is positioned at the height H. The height of the frame placement portion 61 is the height where the sensor substrate 6 is attached, which will be described later. Therefore, the jig 60 can be used to even out the distance from the emission surfaces 22 of all rod-lens arrays 20 to the sensor substrate 6.

(Step 3)

The assembly worker uses the side plate members 50 to couple the second frame 30b and the first frame 30a attached with the rod-lens arrays 20.

Figure 8A:
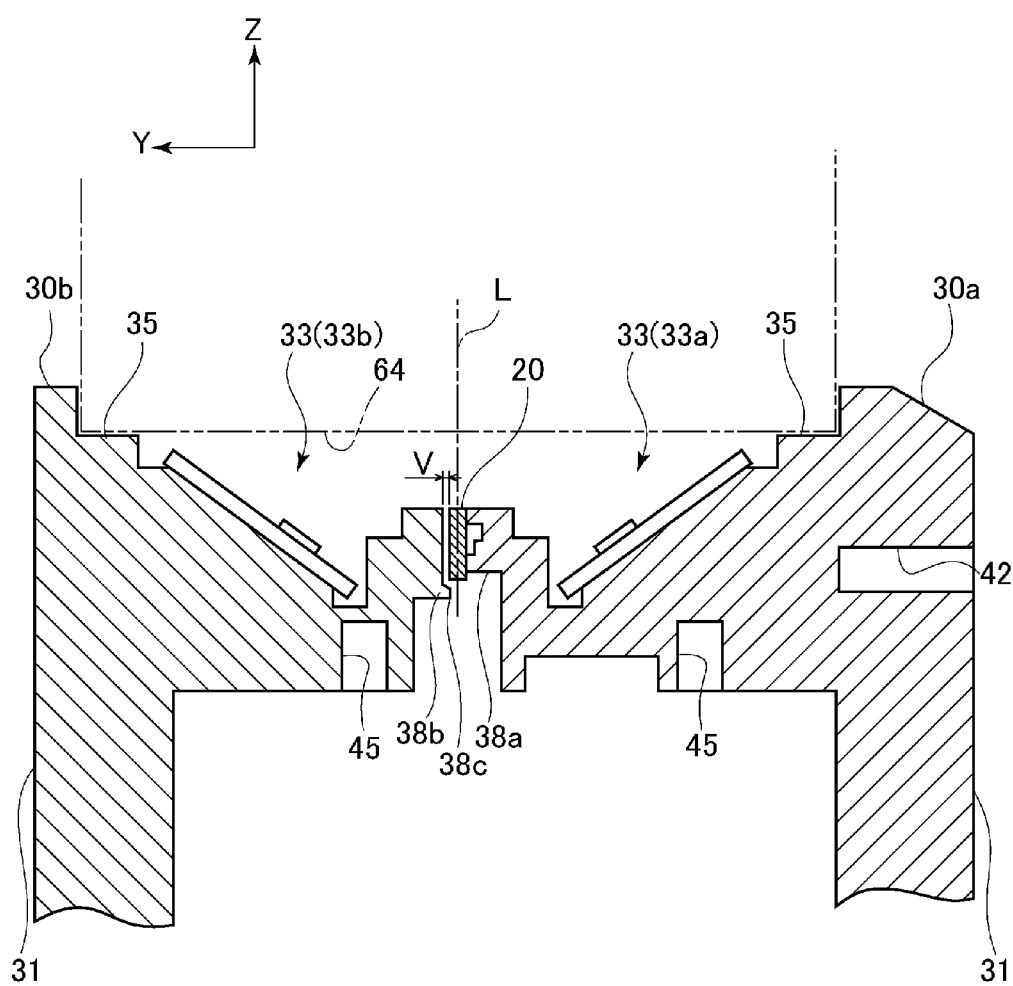
FIG. 8A is a sectional view for explaining a method of coupling the first frame and the second frame.

Specifically, the assembly worker disposes the first frame 30a and the second frame 30b symmetrically about the line L as shown in FIG. 8A. In this case, a jig 64 or like as illustrated by an alternate long and two short dashes line of FIG. 8A that is abutted with the transparent member setting portion 35 of the first frame 30a and abutted with the transparent member setting portion 35 of the second frame 30b can be used to bring the first frame 30a and the second frame 30b into line in the height direction and to position the interval in the sub-scan direction at a predetermined distance. Although the jig 64 is illustrated above in FIG. 8A, it is actually preferable to vertically invert FIG. 8A to position the jig 64 on a work bench to place the first frame 30a and the second frame 30b on the jig 64.

The rod-lens arrays 20 adhered to the first frame 30a do not touch the second frame 30b when the first frame 30a and the second frame 30b are positioned as shown in FIG. 8A. The rod-lens arrays 20 are separated from the second frame 30b, and a gap V in the sub-scan direction is continuously formed throughout the main-scan direction. The gap V is 0.1 mm in the present embodiment, and a protrusion portion 38c, which is a protrusion of part of the second opposing portion 38b, is formed below the rod-lens array 20 (to avoid affecting the light from the emission surface 22) to prevent stray light. The size of the gap V is not limited to this range.

Figure 8B:
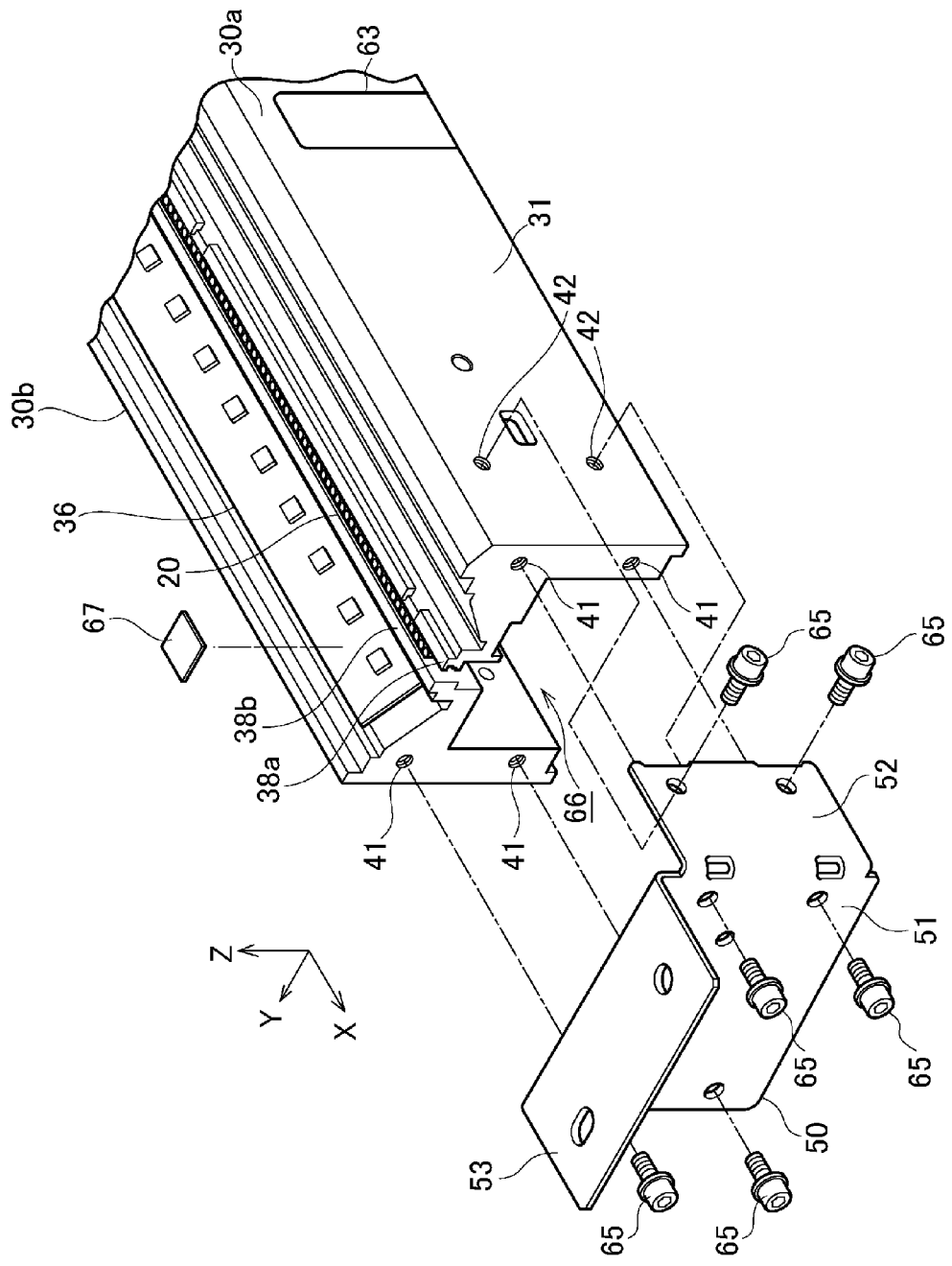
FIG. 8B is a perspective view for explaining the method of coupling the first frame and the second frame.

While the first frame 30a and the second frame 30b are positioned using the jig 64, the assembly worker uses the side plate members 50 to couple the first frame 30a and the second frame 30b as shown in FIG. 8B. The side plate member 50 includes a side plate portion 51, a reinforcement portion 52, and a unit attachment portion 53. The side plate member 50 is molded by, for example, bending a metal. Screws 65 are inserted to insertion holes of the side plate portion 51 and threaded into the screw holes 41 of the first frame 30a and the second frame 30b, and the side plate portion 51 couples the positioned first frame 30a and second frame 30b. The side plate portion 51 blocks an opening 66 in the main-scan direction formed by the first frame 30a and the second frame 30b. The reinforcement portion 52 is formed by being bent from an edge of the side plate portion 51. The screws 65 are inserted to insertion holes of the reinforcement portion 52 and threaded into the screw holes 42 of the first frame 30a, and the reinforcement portion 52 reinforces the coupling between the first frame 30a and the second frame 30b. The unit attachment portion 53 is used to attach the completed image sensor unit 1 to the MFP 100. Although the coupling using the side plate member 50 on one end in the main-scan direction shown in FIG. 8B has been described, the side plate member 50 on the other end in the main-scan direction is similarly used to couple the first frame 30a and the second frame 30b.

The assembly worker attaches a light blocking member 67 to a section between the first opposing portion 38a and the second opposing portion 38b where the rod-lens arrays 20 are not disposed, as necessary as shown in FIG. 8B.

(Step 4)

The assembly worker fixes the cover glass 2 to the first frame 30a and the second frame 30b.

Figure 9A:
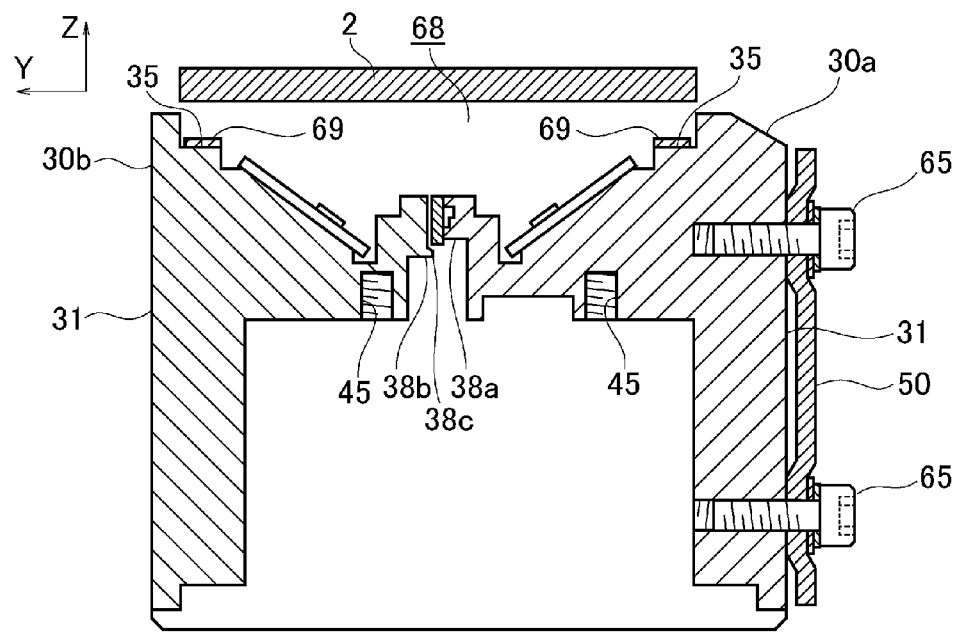
FIG. 9A is a sectional view for explaining a method of fixing a cover glass.

Specifically, the assembly worker attaches double-sided adhesive tapes 69 throughout the main-scan direction of the transparent member setting portions 35 of the first frame 30a and the second frame 30b as shown in FIG. 9A. The assembly worker places the cover glass 2 on the double-sided adhesive tapes 69 to block an opening 68 that opens upward and that is formed by the first frame 30a and the second frame 30b. The cover glass 2 can be further pressurized from above to closely attach the cover glass 2 with the double-sided adhesive tapes 69 to fix the cover glass 2 to the transparent member setting portions 35 of the first frame 30a and the second frame 30b.

Figure 9B:
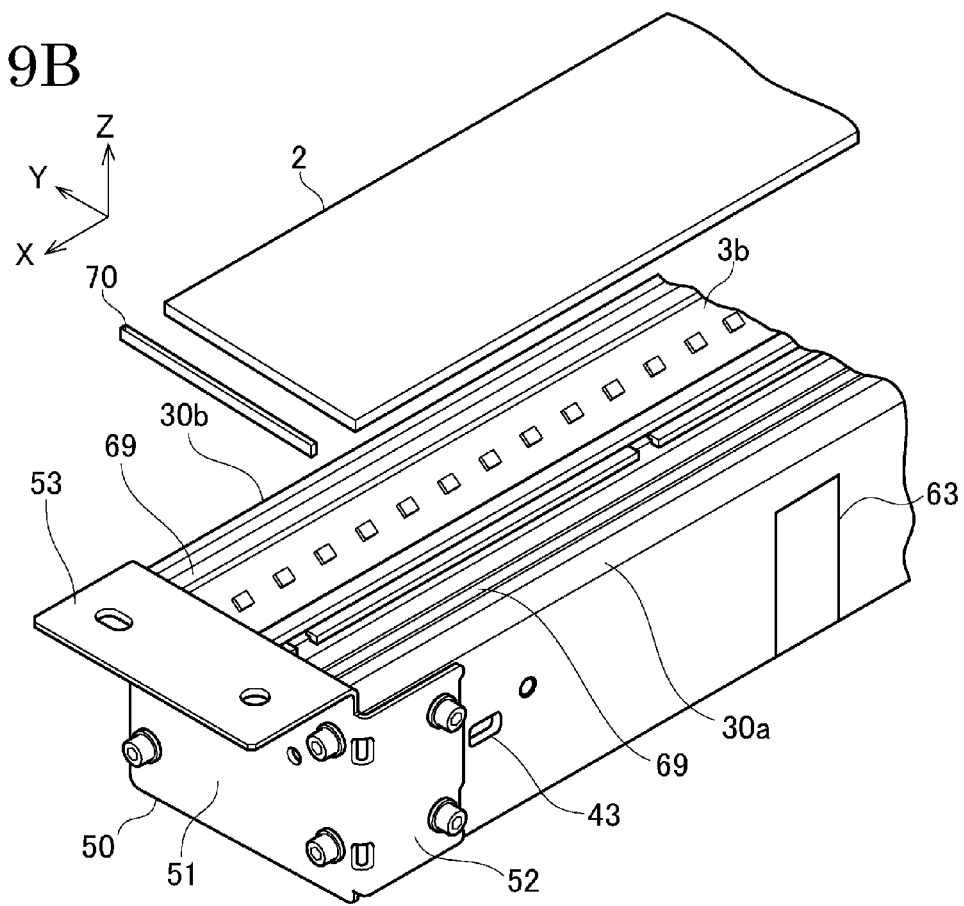
FIG. 9B is a perspective view for explaining the method of fixing the cover glass.

As shown in FIG. 9B, an elastic member 70 formed by, for example, a sponge is attached to an end face of the cover glass 2 to closely attach the side plate portion 51 of the side plate member 50 and the cover glass 2. Therefore, the cover glass 2 is closely attached and fixed between the first frame 30a, the second frame 30b, and the side plate members 50, and this can prevent dust from entering the frame body 80. The elastic member 70 can be attached not only to the end face of one face of the cover glass 2 in the main-scan direction, but also to the end face of the other end.

In this way, when the cover glass 2 is fixed to the transparent member setting portions 35 of the first frame 30a and the second frame 30b, the cover glass 2 is fixed throughout the main-scan direction of the first frame 30a and the second frame 30b. Therefore, the cover glass 2 has an advantageous effect of coupling the first frame 30a and the second frame 30b to increase the rigidity of the frame body 80 itself.

(Step 5)

The assembly worker fixes the sensor substrate 6 to the first frame 30a and the second frame 30b.

Figure 10A:
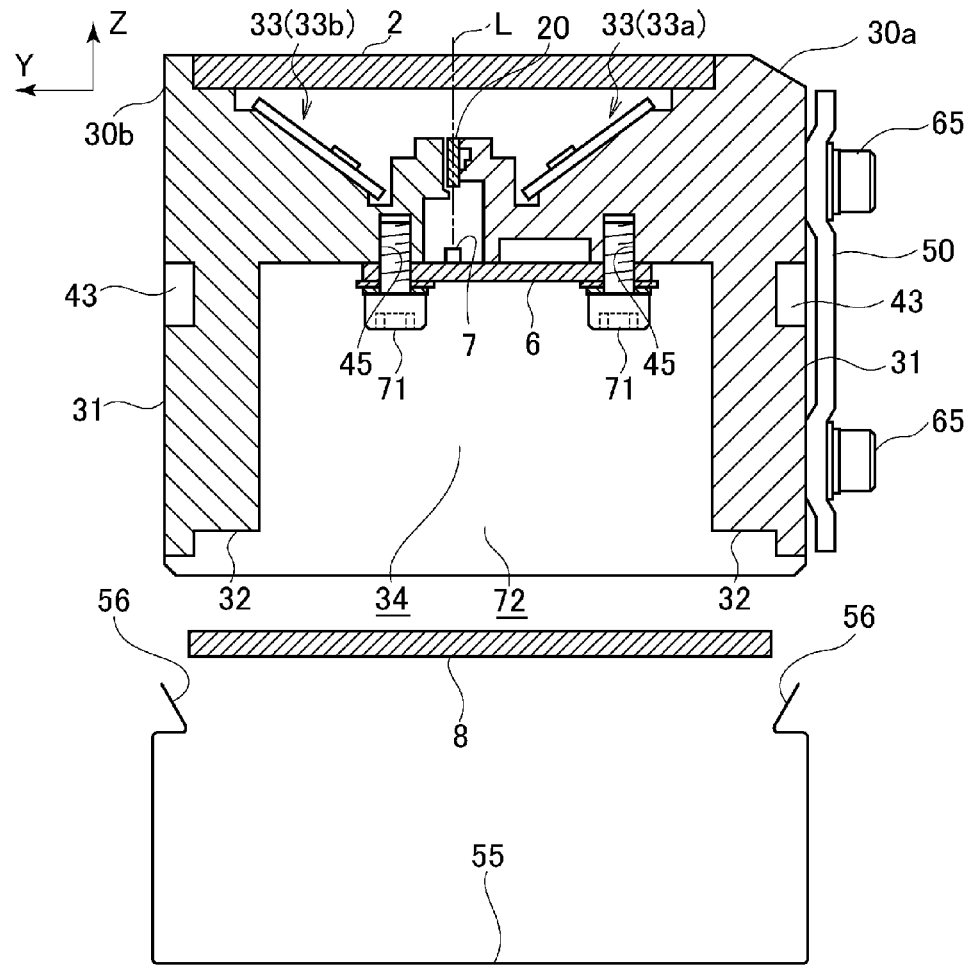
FIG. 10A is a sectional view for explaining a method of fixing a sensor substrate and a lower cover.

Specifically, the assembly worker inserts, from below, the first sensor substrate 6 among the plurality of sensor substrates 6 to the space 34 formed by the first frame 30a and the second frame 30b. The assembly worker abuts the mounting surface of the sensor substrate 6 with the lower surfaces of the extended portions 33a and 33b of the first frame 30a and the second frame 30b and disposes and positions the sensor chip 7 of the sensor substrate 6 just below the rod-lens array 20, i.e. in the main-scan direction. As shown in FIG. 10A, while the sensor substrate 6 is positioned, the assembly worker inserts screws 71 to insertion holes formed on the sensor substrate 6 to thread the screws 71 into the screw holes 45 of the first frame 30a and the second frame 30b to fix the sensor substrate 6 to the first frame 30a and the second frame 30b. It is actually preferable to vertically invert FIG. 10A to fix the sensor substrate 6 by the screws 71.

The assembly worker similarly positions the second sensor substrate 6 and the third sensor substrate 6 to dispose the sensor chips 7 just below the rod-lens arrays 20. The assembly worker threads the screws 71 into the screw holes 45 of the first frame 30a and the second frame 30b to fix the sensor substrates 6 to the first frame 30a and the second frame 30b.

(Step 6)

The assembly worker fixes the lower cover 8 to the first frame 30a and the second frame 30b.

Specifically, the assembly worker attaches, from below, the lower cover 8 to the cover setting portions 32 of the first frame 30a and the second frame 30b to block the opening 72 that opens downward and that is formed by the first frame 30a and the second frame 30b as shown in FIG. 10A. It is actually preferable to vertically invert FIG. 10A to attach the lower cover 8 to the cover setting portions 32.

Figure 10B:
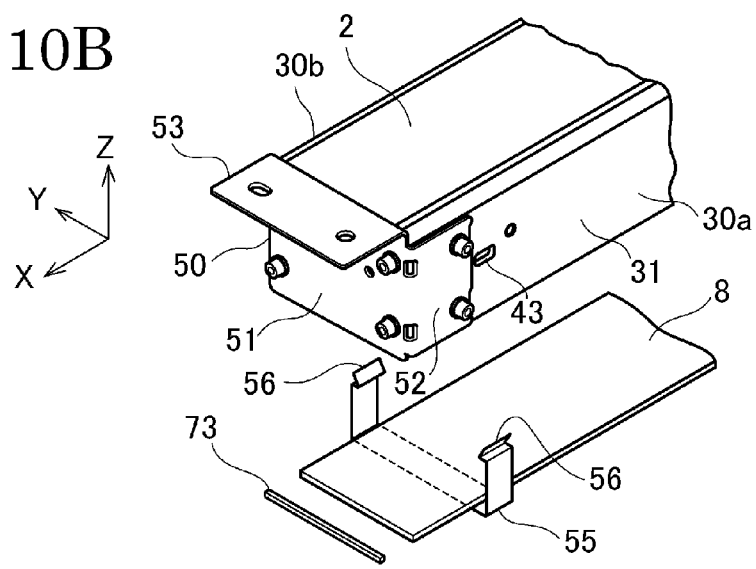
FIG. 10B is a perspective view for explaining a method of fixing the lower cover.

As shown in FIG. 10B, an elastic member 73 formed by, for example, a sponge is attached to an end face of the lower cover 8 to closely attach the side plate portion 51 of the side plate member 50 and the lower cover 8. Therefore, the side plate portions 51 and the lower cover 8 are closely attached when the lower cover 8 is attached to the first frame 30a and the second frame 30b, and this can prevent dust from entering the frame body 80. The elastic member 73 can be attached not only to the end face of one end in the main-scan direction of the lower cover 8, but also to the end face of the other end in the main-scan direction.

The assembly worker uses the plurality of cover holding members 55 to fix the attached lower cover 8. The cover holding member 55, formed in a substantially U-shaped cross section, includes holding portions 56 for inserting the first frame 30a and the second frame 30b from both sides in the sub-scan direction. The cover holding member 55 is formed by, for example, bending a leaf spring. The assembly worker inserts the first frame 30*a* and the second frame 30*b* while spreading the holding portions 56 on both sides of the cover holding member 55 against the force. The holding portions 56 can be inserted and locked with the locking grooves 43 of the first frame 30*a* and the second frame 30*b* to hold the lower cover 8 to prevent the first frame 30*a* and the second frame 30*b* from falling off.

The image sensor unit 1 is manufactured through the steps 1 to 6. The manufactured image sensor unit 1 is incorporated into the MFP 100 through the unit attachment portion 53 of the side plate member 50.

According to the present embodiment, the frame body 80 is divided into the first frame 30*a* and the second frame 30*b* across the disposing portion 40 on which the rod-lens arrays 20 are disposed, and therefore, the rod-lens arrays 20 can be fixed to the first frame 30*a* separated from the second frame 30*b*. More specifically, a wide space for holding the rod-lens arrays 20 can be secured when the plurality of rod-lens arrays 20 are positioned. Therefore, the plurality of rod-lens arrays 20 can be accurately disposed in the main-scan direction, and the workability can be improved.

As described, the rod-lens arrays 20 are not in contact with the second frame 30*b* in the assembled image sensor unit 1 and are fixed only with the first frame 30*a*. Therefore, even if the first frame 30*a* and the second frame 30*b* are displaced and coupled, the displacement does not affect the rod-lens arrays 20 through the second frame 30*b*, and the rod-lens arrays 20 can always focus light from the original D on the sensor chips 7 accurately.

(Second Embodiment)

Figure 11:
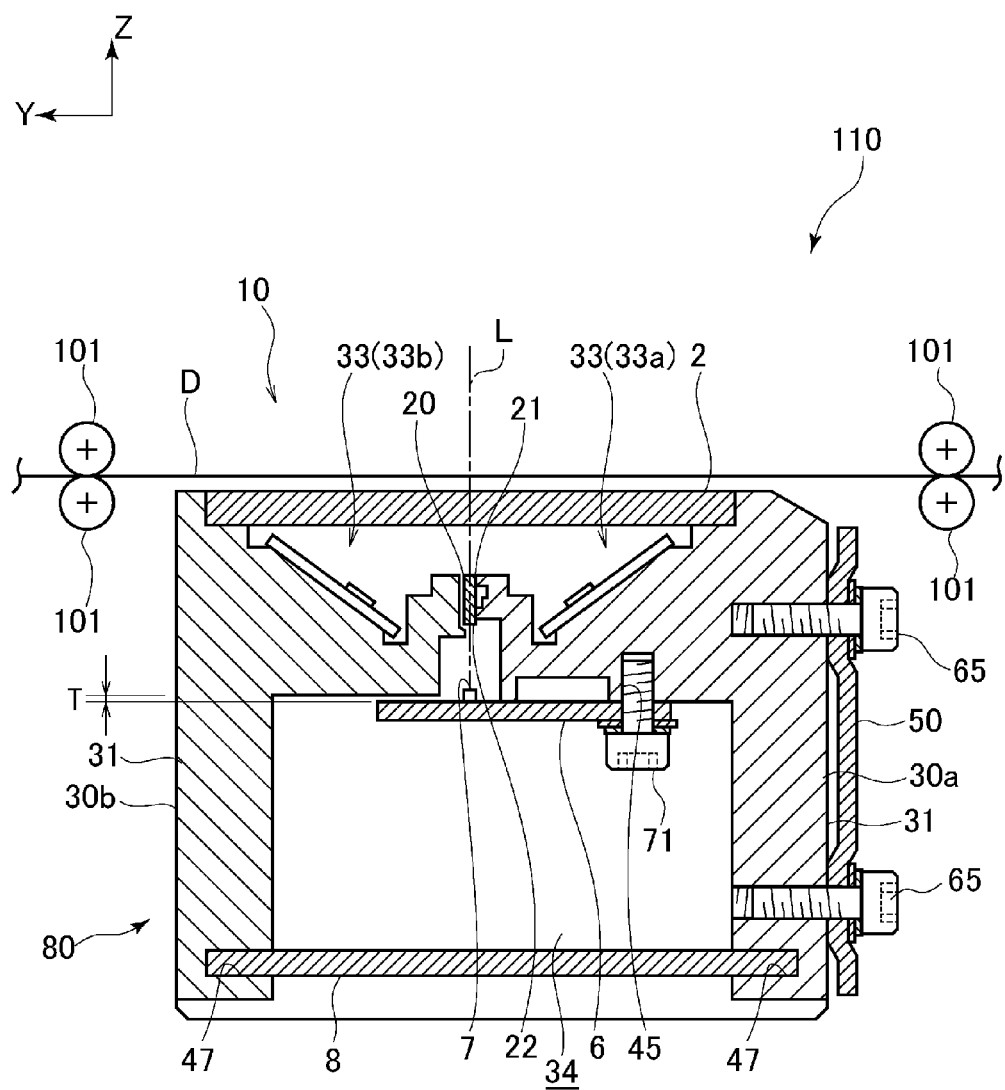
FIG. 11 is a sectional view illustrating a configuration of part of the image reading portion in the MFP including an image sensor unit according to a second embodiment.

An image sensor unit 10 according to a second embodiment will be described with reference to FIG. 11. FIG. 11 is a sectional view illustrating a configuration of the image reading portion 110 in the MFP 100 including the image-sensor unit 10 according to the second embodiment.

Compared to the first embodiment, a method of fixing the sensor substrate 6 to the frame body 80 and a method of fixing the lower cover 8 to the frame body 80 are different in the image sensor unit 10 of the present embodiment. The other configurations are similar to those of the first embodiment. The same reference numerals are provided, and the description will not be repeated.

The method of fixing the sensor substrate 6 to the frame body 80 will be described. As shown in FIG. 11, the sensor substrate 6 of the present embodiment is just fixed, through the screws 71, to the screw holes 45 formed at predetermined intervals in the main-scan direction of the first frame 30*a* and is not fixed to the second frame 30*b*. More specifically, the sensor substrate 6 fixed to the first frame 30*a* is not in contact with the second frame 30*b* and is separated from the second frame 30*b* as shown in FIG. 11, and a gap T in the vertical direction is continuously formed throughout the main-scan direction.

More specifically, when the first frame 30*a* and the second frame 30*b* are displaced and coupled in the method of also fixing the sensor substrate 6 to the second frame 30*b* as in the first embodiment, the sensor substrate 6 is fixed to the first frame 30*a* and the second frame 30*b* according to the displacement. Therefore, the relative position between the sensor chip 7 and the rod-lens array 20 may be displaced. In the present embodiment, the sensor substrate 6 is not in contact with the second frame 30*b* and is fixed only to the first frame 30*a*. As a result, the relative position between the sensor chip 7 of the sensor substrate 6 and the rod-lens array 20 fixed only to the first frame 30*a* can be secured with high accuracy. Even if there is a temperature change or the like, the positional relationship between the optical axis (line L shown in FIG. 5), which is formed between the incident surface 21 and the emission surface 22 of the rod-lens array 20, and the sensor chip 7 can reduce the displacement in the sub-scan direction (width direction). This can reduce the possibility of deteriorating the reading accuracy.

The method of fixing the lower cover 8 to the frame body 80 will be described. In the present embodiment, insertion grooves 47 for inserting the lower cover 8 are continuously formed in the main-scan direction inside of the side wall parts 31 of the first frame 30*a* and the second frame 30*b*, i.e. inside of the space 34. Therefore, the assembly worker inserts the lower cover 8 to the insertion grooves 47 from the end faces of the first frame 30*a* and the second frame 30*b* to fix the lower cover 8 to the first frame 30*a* and the second frame 30*b*. In this way, the lower cover 8 can be inserted to the insertion grooves 47 to fix the first frame 30*a* and the second frame 30*b* to prevent dust from entering from the gap between the lower cover 8 and the first and second frames 30*a* and 30*b*. As in the first embodiment, the elastic member 73 may be attached to the end face of the lower cover 8 for close attachment with the side plate member 50.

Although the present invention has been described along with various embodiments, the present invention is not limited to the embodiments, and changes and the like can be made within the scope of the present invention.

For example, although the case of using aluminum or an aluminum alloy as a material of the first frame 30*a* and the second frame 30*b* has been described, the present invention is not limited to the case, and any material may be used as long as the material is rigid. However, a material without rigidity, such as a resin, can be used as long as the material can prevent the frame body 80 from hanging down due to the weight of the frame body 80.

Although the case of using the substrate 5 provided with a plurality of LED chips as the light sources 3 has been described in the embodiments, the present invention is not limited to the case. For example, a combination of a light guide with substantially the same length as the read length and an LED chip disposed on the end face of the light guide can be used as a light source. The light guide can internally propagate the light of the LED chip entered from the end face and linearly illuminate the light on the original D.

Although the case of using the double-sided adhesive tapes 69 to fix the cover glass 2 to the frame body 80 has been described in the embodiments, the present invention is not limited to the case, and an adhesive may be used to fix the cover glass 2.

Although the case of using the jig 64 and the like as illustrated by the alternate long and two short dashes line of FIG. 8A to position the first frame 30*a* and the second frame 30*b* has been described in the step 3 of the embodiments, the present invention is not limited to the case. For example, in place of the jig 64, the cover glass 2 may be used for the positioning, and the cover glass 2 may be attached to the first frame 30*a* and the second frame 30*b* at the same time as the positioning.

According to the present invention, a plurality of rod-lens arrays can be accurately disposed in disposing the plurality of rod-lens arrays in a line in the main-scan direction.

What is claimed is:

1. An image sensor unit comprising:
   sensor substrates on which a plurality of photoelectric conversion elements are mounted;
   a plurality of rod-lens arrays that focus light from an object to be read on the sensor substrates; and a frame body that houses the plurality of sensor substrates and the plurality of rod-lens arrays, wherein the frame body is divided into a first frame and a second frame, wherein only a single side surface of the plurality of rod-lens arrays in a sub-scan direction is fixed to the frame body;

wherein the single side surface is fixed to the first frame, wherein the plurality of rod-lens arrays are arranged in the main-scan direction, wherein the plurality of rod-lens arrays is fixed to the first frame by applying a first adhesive and a second adhesive, respectively, wherein the viscosity of the first adhesive exceeds the viscosity of the second adhesive, and wherein the adhesive range of the first adhesive is greater than the adhesive range of the second adhesive.

2. The image sensor unit according to claim 1, wherein when the first frame and the second frame are coupled, a space is formed between the rod-lens arrays and the second frame throughout the main-scan direction.

3. The image sensor unit according to claim 1, wherein one end of the sensor substrates in the sub-scan direction is fixed only by the first frame.

4. The image sensor unit according to claim 3, wherein when the first frame and the second frame are coupled, a gap is formed between the sensor substrates and the second frame throughout the main-scan direction.

5. The image sensor unit according to claim 1, wherein the first frame and the second frame are coupled by a side plate member which blocks an opening that opens in the main-scan direction.

6. The image sensor unit according to claim 5, wherein the first frame and the second frame are coupled by a transparent member which blocks an opening that opens in a direction orthogonal to the main-scan direction and the sub-scan direction, toward the object to be read.

7. The image sensor unit according to claim 5, wherein a cover member is attached to the first frame and the second frame, the cover member blocking an opening that opens in the direction orthogonal to the main-scan direction and the sub-scan direction, toward an opposite side of the object to be read.

8. The image sensor unit according to claim 5, wherein a transparent member is attached to the first frame and the second frame, the transparent member blocking an opening that opens in the direction orthogonal to the main-scan direction and the sub-scan direction, toward the object to be read, and an elastic member, which closely attaches an end face of the transparent member facing the side plate member and the side plate member, is included between the end face and the side plate member.

9. The image sensor unit according to claim 5, wherein a cover member is attached to the first frame and the second frame, the cover member blocking an opening that opens in the direction orthogonal to the main-scan direction and the sub-scan direction, toward an opposite side of the object to be read, and an elastic member, which closely attaches an end face of the cover member facing the side plate member and the side plate member, is included between the end face and the side plate member.

10. The image sensor unit according to claim 1, wherein one side surface of the two side surfaces of the plurality of rod-lens arrays in a sub-scan direction and the first frame face each other, and the other side surface of the two side surfaces of the plurality of rod-lens arrays in the sub-scan direction and the second frame face each other.

11. An image reading apparatus comprising:

an image sensor unit comprising:

sensor substrates on which a plurality of photoelectric conversion elements are mounted;

a plurality of rod-lens arrays that focus light from an object to be read on the sensor substrates; and a frame body that houses the plurality of sensor substrates and the plurality of rod-lens arrays, wherein the frame body is divided into a first frame and a second frame, wherein only a single side surface of the plurality of rod-lens arrays in a sub-scan direction is fixed to the frame body;

wherein the single side surface is fixed to the first frame, and the plurality of rod-lens arrays are arranged in the main-scan direction, wherein the plurality of rod-lens arrays is fixed to the first frame by applying a first adhesive and a second adhesive, respectively, wherein the viscosity of the first adhesive exceeds the viscosity of the second adhesive, and wherein the adhesive range of the first adhesive is greater than the adhesive range of the second adhesive; and image reading means that reads the light from the object to be read while relatively moving the image sensor unit and the object to be read.

12. An image forming apparatus comprising:

an image sensor unit comprising:

sensor substrates on which a plurality of photoelectric conversion elements are mounted;

a plurality of rod-lens arrays that focus light from an object to be read on the sensor substrates; and a frame body that houses the plurality of sensor substrates and the plurality of rod-lens arrays, wherein the frame body is divided into a first frame and a second frame, wherein only a single a side surface of the plurality of rod-lens arrays in a sub-scan direction is fixed to the frame body;

wherein the single side surface is fixed to the first frame, and the plurality of rod-lens arrays are arranged in the main-scan direction, wherein the plurality of rod-lens arrays is fixed to the first frame by applying a first adhesive and a second adhesive, respectively, wherein the viscosity of the first adhesive exceeds the viscosity of the second adhesive, and wherein the adhesive range of the first adhesive is greater than the adhesive range of the second adhesive;

image reading means that reads the light from the object to be read while relatively moving the image sensor unit and the object to be read; and image forming means that forms an image on a recording medium.

13. A manufacturing method of an image sensor unit, the image sensor unit comprising:

sensor substrates on which a plurality of photoelectric conversion elements are mounted;

a plurality of rod-lens arrays that focus light from an object to be read on the sensor substrates; and a frame body that houses the plurality of sensor substrates and the plurality of rod-lens arrays, wherein the frame body is divided into a first frame and a second frame, wherein only a single a side surface of the plurality of rod-lens arrays in a sub-scan direction is fixed to the frame body;

wherein the single side surface is fixed to the first frame, and the plurality of rod-lens arrays are arranged in the main-scan direction, the manufacturing method comprising:

a rod-lens array fixation step of fixing the plurality of rod-lens arrays to the first frame by applying a first adhesive and a second adhesive, respectively, while the plurality of rod-lens arrays are arranged in a line in the main-scan direction; and a step of coupling the second frame and the first frame to which the plurality of rod-lens arrays are fixed, wherein the viscosity of the first adhesive exceeds the viscosity of the second adhesive on the rod-lens array fixation step, and wherein the adhesive range of the first adhesive is greater than the adhesive range of the second adhesive.

14. The manufacturing method of the image sensor unit according to claim 13, wherein the rod-lens array fixation step comprises:

a step of positioning the plurality of rod-lens arrays and the first frame through a jig; and a step of adjusting intervals between adjacent rod-lens arrays among the plurality of rod-lens arrays.

15. The manufacturing method of the image sensor unit according to claim 13, wherein the rod-lens array fixation step comprises:

a step of adjusting intervals between adjacent rod-lens arrays among the plurality of rod-lens arrays, wherein the second adhesive cures faster than the first adhesive.

\* \* \* \* \*